(12) United States Patent
Latham

(10) Patent No.: US 10,557,873 B2
(45) Date of Patent: Feb. 11, 2020

(54) SYSTEMS AND METHODS FOR CLOSED LOOP CURRENT SENSING

(71) Applicant: Allegro MicroSystems, LLC, Manchester, NH (US)

(72) Inventor: Alexander Latham, Harvard, MA (US)

(73) Assignee: Allegro MicroSystems, LLC, Manchester, NH (US)

(*) Notice: Subject to any disclaimer, the term of this patent is extended or adjusted under 35 U.S.C. 154(b) by 113 days.

(21) Appl. No.: 15/653,820

(22) Filed: Jul. 19, 2017

(65) Prior Publication Data
US 2019/0025346 A1    Jan. 24, 2019

(51) Int. Cl.
| | |
|---|---|
| G01R 15/18 | (2006.01) |
| G01R 15/20 | (2006.01) |
| G01R 33/07 | (2006.01) |
| G01R 33/09 | (2006.01) |
| G01R 33/00 | (2006.01) |
| G01B 7/02 | (2006.01) |

(Continued)

(52) U.S. Cl.
CPC ............ *G01R 15/185* (2013.01); *F04B 49/06* (2013.01); *G01B 7/023* (2013.01); *G01R 15/20* (2013.01); *G01R 15/202* (2013.01); *G01R 15/205* (2013.01); *G01R 31/28* (2013.01); *G01R 33/0082* (2013.01); *G01R 33/072* (2013.01); *G01R 33/09* (2013.01)

(58) Field of Classification Search
CPC .. G01R 15/185; G01R 31/28; G01R 33/0082; G01R 33/072; G01R 15/20; G01R 33/09; F04B 49/06; G01B 7/023

USPC ......................................................... 324/246
See application file for complete search history.

(56) References Cited

U.S. PATENT DOCUMENTS

| | | | | |
|---|---|---|---|---|
| 3,323,057 A | * | 5/1967 | Haley | ................... G01R 15/202 |
| | | | | 324/117 R |
| 4,274,051 A | * | 6/1981 | Condon | .................. G01R 19/20 |
| | | | | 324/117 R |

(Continued)

OTHER PUBLICATIONS

U.S. Appl. No. 15/161,553, filed May 23, 2016, Latham, et al.
U.S. Appl. No. 15/435,725, filed Feb. 17, 2017, Feucht, et al.
U.S. Appl. No. 15/496,152, filed Apr. 25, 2017, Bussing, et al.

*Primary Examiner* — Christopher P McAndrew
(74) *Attorney, Agent, or Firm* — Daly, Crowley, Mofford & Durkee, LLP

(57) ABSTRACT

A current sensor for sensing a direct magnetic field generated by a current through a conductor includes at least one first magnetic field sensing element spaced from at least one second magnetic field sensing element, with the magnetic field sensing elements configured to sense the direct magnetic field at different magnitudes. The direct magnetic field has a first direct coupling factor with respect to the at least one first magnetic field sensing element and a second direct coupling factor with respect to the at least one second magnetic field sensing element. A feedback conductor configured to carry a feedback current generates a feedback magnetic field that has a first feedback coupling factor with respect to the at least one first magnetic field sensing element and a second feedback coupling factor with respect to the at least one second magnetic field sensing element. A circuit generates the feedback current based on the direct and feedback magnetic fields and a sense element senses the feedback current.

34 Claims, 9 Drawing Sheets

(51) Int. Cl.
*G01R 31/28* (2006.01)
*F04B 49/06* (2006.01)

(56) References Cited

U.S. PATENT DOCUMENTS

| | | | |
|---|---|---|---|
| 4,914,381 A * | 4/1990 | Narod | G01R 15/185 |
| | | | 324/117 R |
| 4,914,383 A * | 4/1990 | Wilkerson | G01R 15/185 |
| | | | 324/117 H |
| 4,970,459 A * | 11/1990 | Germer | G01R 15/185 |
| | | | 324/127 |
| 5,241,263 A * | 8/1993 | Naoi | G01R 15/202 |
| | | | 324/117 H |
| 6,323,634 B1 * | 11/2001 | Nakagawa | G01R 15/20 |
| | | | 324/117 R |
| 6,356,068 B1 | 3/2002 | Steiner et al. | |
| 6,411,078 B1 * | 6/2002 | Nakagawa | G01R 15/183 |
| | | | 324/117 H |
| 6,995,315 B2 | 2/2006 | Sharma et al. | |
| 7,075,287 B1 | 7/2006 | Mangtani et al. | |
| 7,166,807 B2 | 1/2007 | Gagnon et al. | |
| 7,259,545 B2 | 8/2007 | Stauth et al. | |
| 7,476,816 B2 | 1/2009 | Doogue et al. | |
| 7,518,354 B2 | 4/2009 | Stauth et al. | |
| 7,598,601 B2 | 10/2009 | Taylor et al. | |
| 7,709,754 B2 | 5/2010 | Doogue et al. | |
| 7,746,056 B2 | 6/2010 | Stauth et al. | |
| 7,816,905 B2 | 10/2010 | Doogue et al. | |
| 7,973,527 B2 | 7/2011 | Taylor et al. | |
| 8,063,634 B2 | 11/2011 | Sauber et al. | |
| 8,080,994 B2 | 12/2011 | Taylor et al. | |
| 8,805,628 B2 * | 8/2014 | Patel | G01R 35/04 |
| | | | 702/62 |
| 8,907,669 B2 | 12/2014 | Petrie | |
| 9,030,197 B1 * | 5/2015 | Meske | G01R 33/0017 |
| | | | 324/225 |
| 9,081,041 B2 | 7/2015 | Friedrich et al. | |
| 9,190,606 B2 | 11/2015 | Liu et al. | |
| 9,612,262 B1 * | 4/2017 | Nehmeh | G01R 15/202 |
| 2003/0057938 A1 * | 3/2003 | Goetz | G01R 33/09 |
| | | | 324/117 R |
| 2009/0212771 A1 * | 8/2009 | Cummings | G01R 15/205 |
| | | | 324/252 |
| 2010/0301852 A1 * | 12/2010 | Teppan | G01R 15/18 |
| | | | 324/253 |
| 2012/0025819 A1 * | 2/2012 | Phan Le | G01R 33/09 |
| | | | 324/252 |
| 2014/0028290 A1 * | 1/2014 | Petrie | G01R 15/207 |
| | | | 324/144 |
| 2014/0103920 A1 * | 4/2014 | Sinanoglu | G01R 33/04 |
| | | | 324/247 |
| 2014/0103921 A1 * | 4/2014 | Raman | G01R 33/0023 |
| | | | 324/251 |
| 2014/0300350 A1 * | 10/2014 | Teppan | G01R 15/185 |
| | | | 324/244 |
| 2015/0022187 A1 | 1/2015 | Taylor et al. | |
| 2015/0198634 A1 * | 7/2015 | Brinlee | G01R 31/28 |
| | | | 324/72.5 |
| 2015/0212166 A1 * | 7/2015 | Kandori | A61B 5/055 |
| | | | 324/252 |
| 2015/0276816 A1 * | 10/2015 | Yoshida | G01R 15/185 |
| | | | 324/244 |
| 2016/0356628 A1 * | 12/2016 | Foletto | G01D 5/142 |
| 2017/0115328 A1 * | 4/2017 | Seki | G01R 15/186 |

\* cited by examiner

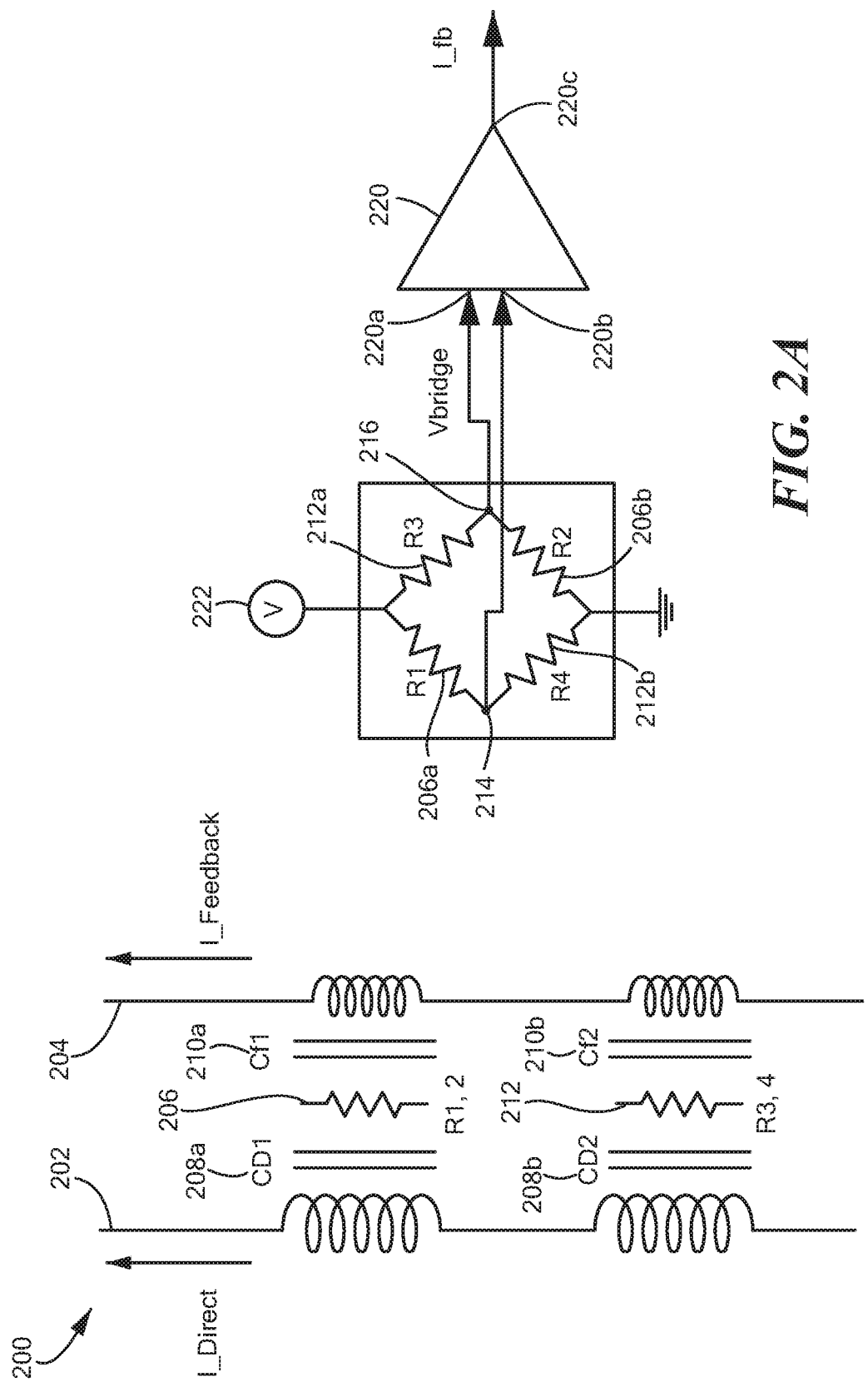

SYSTEMS AND METHODS FOR CLOSED LOOP CURRENT SENSING

BACKGROUND

Some conventional electrical current sensors are positioned near a current-carrying conductor to sense a magnetic field generated by the current through the conductor. The current sensor generates an output signal having a magnitude proportional to the magnetic field induced by the current through the conductor.

Current sensors can be arranged in either an open loop or a closed loop configuration. An "open loop" current sensor includes a magnetic field transducer in proximity to a current-carrying, or primary, conductor. The magnetic field transducer provides an output signal proportional to the magnetic field generated by current passing through the primary conductor. A "closed loop" current sensor additionally includes a secondary conductor in proximity to the magnetic field transducer. A current is passed through the secondary conductor in order to generate a magnetic field that opposes and cancels the magnetic field generated by a current passing through the primary conductor. In some closed loop current sensors, a measure of the secondary conductor current can provide an indication of the level of the current passing through the primary conductor.

Some current sensors can include more than one magnetic field sensing element spaced from each other and positioned at different distances from the primary conductor. In such systems, a difference between the magnetic field, as sensed by each of the spaced elements, can be indicative of the current passing through the primary conductor.

The accuracy with which a magnetic field-based current sensor senses an intended current can be affected by its immunity to stray magnetic fields. Some conventional current sensors employ shields, sometimes in the form of a ferrite or other magnetic core positioned around the conductor, to concentrate the magnetic field in the vicinity of the sensor and to thereby provide a level of shielding against stray fields, such as those that may be caused by currents flowing in adjacent conductors.

SUMMARY

Systems and methods described herein are directed towards closed loop current sensing for sensing a direct magnetic field generated by a current through a conductor. A current sensor can be provided having at least two magnetic field sensing elements spaced from each other and configured to sense the direct magnetic field at different magnitudes. The current sensor further includes a feedback conductor configured to carry a feedback current generating a feedback magnetic field, that can be provided proximate to one or more of the magnetic field sensing elements to modify outputs of the one or more magnetic field sensing elements. The closed loop current sensor techniques described herein can be utilized for differential sensing and gradient sensing.

For example, in a closed loop differential current sensor, two magnetic field sensing elements may be spaced from each other and sense the direct magnetic field in opposite directions (e.g., first magnetic field sensing element senses +B and second magnetic field sensing element senses −B). The feedback conductor can be configured such that in the closed loop system, the feedback conductor generates −B on the first magnetic field sensing element and +B on the second magnetic field sensing element to bring the field at the first magnetic field sensing element and the second magnetic field sensing element to approximately zero.

In a closed loop gradient current sensor, two magnetic field sensing elements may be spaced from each other and sense the direct magnetic field in the same direction. Thus, the first magnetic field sensing element may sense +2B, and the second magnetic field sensing element may sense +B. The closed loop current sensor drives a difference between the magnetic field experienced by the two magnetic field sensing elements to approximately zero or to some other desired magnetic field level or equilibrium point. The feedback conductor can be configured to provide different feedback coupling factors with respect to the respective magnetic field sensing elements and thus also bring the field on the respective magnetic field sensing elements to approximately zero or to some other desired magnetic field level or equilibrium point (as the closed loop current sensor drives the difference between the field on the two magnetic field sensing elements to zero). For example, in one embodiment, the feedback conductor can be disposed such that it provides two times more coupling (e.g., coils, turns) to the first magnetic field sensing element as compared to the second magnetic field sensing element. Thus, the feedback conductor can be configured such that in the closed loop gradient system, the feedback conductor generates −2B on the first magnetic field sensing element and −B on the second magnetic field sensing element to bring the field experienced by the first and second magnetic field sensing elements to approximately zero (or to some other desired magnetic field level or equilibrium point).

It should be appreciated that equilibrium or an equilibrium point as used herein may refer to utilizing a closed loop system to drive a difference between magnetic field levels experienced by two or more magnetic field sensing elements to approximately zero or to some other desired field level, designing the feedback conductor to drive a magnetic field level experienced by two or more magnetic field sensing elements to approximately zero or to some other desired field level, or a combination of these two mechanisms or methods.

In an embodiment, the current sensor can be configured to match the ratio of the feedback conductor coupling to each of the magnetic field sensing elements to the ratio of the primary conductor coupling to each of the magnetic field sensing elements.

The feedback conductor may be positioned such that it is proximate to a first magnetic field sensing element and distal from a second magnetic field sensing element. The first magnetic field sensing element may sense a greater direct magnetic field from the conductor than the second magnetic field sensing element and thus, the feedback conductor can create a −B field on the first magnetic field sensing element to bring a field experienced by the first magnetic field sensing element to a desired level or approximately zero and by operation of the closed loop system, to bring the difference in the field on the respective magnetic field sensing elements to a desired level or approximately zero.

The properties of the feedback conductor can also be modified to adjust a coupling factor of the feedback conductor to one or more of the magnetic field sensing elements. For example, one or more different portions of the feedback conductor can have varying thicknesses and/or widths, such that a first portion of the feedback conductor provides a first coupling factor and a second portion of the feedback conductor provides a second coupling factor.

In some embodiments, the properties of the feedback conductor can be modified using programmable means. For example, the current sensor can include a switching circuit coupled to the feedback conductor to change a configuration of the feedback conductor such that different portions of the feedback conductor provide different coupling factors. The switching circuit can selectively connect or disconnect different portions of the feedback conductor to increase or decrease a coupling factor of respective conductor portions to one or more magnetic field sensing elements. In some embodiments, the properties of the feedback conductor can be actively tuned during operation of the current sensor to bring the field on the respective magnetic field sensing elements to approximately zero.

It should be appreciated that the systems and methods described herein can be applied in any current sensor system where gradient or differential (e.g., mismatched) magnetic field sensing is implemented.

In a first aspect, a current sensor for sensing a direct magnetic field generated by a current through a conductor includes a plurality of magnetic field sensing elements comprising at least one first magnetic field sensing element spaced from at least one second magnetic field sensing element. The at least one first magnetic field sensing element and the at least one second magnetic field sensing element are configured to sense the direct magnetic field at different magnitudes and the direct magnetic field has a first direct coupling factor with respect to the at least one first magnetic field sensing element and a second direct coupling factor with respect to the at least one second magnetic field sensing element. The current sensor includes a feedback conductor configured to carry a feedback current generating a feedback magnetic field, the feedback magnetic field has a first feedback coupling factor with respect to the at least one first magnetic field sensing element and a second feedback coupling factor with respect to the at least one second magnetic field sensing element. The first feedback coupling factor is different than the second feedback coupling factor. The current sensor includes a circuit coupled to the plurality of magnetic field sensing elements and configured to generate the feedback current for coupling to the feedback conductor based on the direct magnetic field and the feedback magnetic field and a sense element coupled to the feedback conductor to sense the feedback current.

The circuit can include a differential amplifier having a first input coupled to the at least one first magnetic field sensing element, a second input coupled to the at least one second magnetic field sensing element, and an output at which the feedback current is provided.

The feedback conductor may include a first portion disposed proximate to the at least one first magnetic field sensing element and a second portion disposed proximate to the at least one second magnetic field sensing element. In some embodiments, the first portion has a first number of turns corresponding to the first feedback coupling factor and the second portion has a second, different number of turns corresponding to the second feedback coupling factor. In some embodiments, the first portion has a first width corresponding to the first feedback coupling factor and the second portion has a second, different width corresponding to the second feedback coupling factor.

The first feedback coupling factor can correspond to a first distance between the feedback conductor and the at least one first magnetic field sensing element and the second feedback coupling factor can correspond to a second distance between the feedback conductor and the at least one second magnetic field sensing element. In some embodiments, the second feedback coupling factor can be substantially null. A ratio of the first direct coupling factor to the first feedback coupling factor can be approximately equal to a ratio of the second direct coupling factor to the second feedback coupling factor.

A switching circuit can be coupled to the feedback conductor and configured to modify one or both of the first feedback coupling factor and the second feedback coupling factor. The circuit may include an amplifier coupled to the plurality of magnetic field sensing elements.

In some embodiments, the conductor can be external to the current sensor. The sense element can include one or more resistive elements.

The plurality of magnetic field sensing elements may include one or more of magnetoresistance elements or Hall effect elements. The one or more magnetoresistance elements may include at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

In some embodiments, a resistance value of the first portion of the feedback conductor can be approximately equal to a resistance value of the second portion of the feedback conductor. For example, the resistance values of the first and second portion of the feedback conductor can be made equal to keep the first and second portions at equal temperatures (e.g., maintain the heating from each portion of the feedback conductor at equal amounts).

In another aspect, a method for sensing a direct magnetic field generated by a current through a conductor includes providing a plurality of magnetic field sensing elements comprising at least one first magnetic field sensing element spaced from at least one second magnetic field sensing element such that the at least one first magnetic field sensing element and the at least one second magnetic field sensing element are configured to sense the direct magnetic field at different magnitudes. The direct magnetic field has a first direct coupling factor with respect to the at least one first magnetic field sensing element and a second direct coupling factor with respect to the at least one second magnetic field sensing element. The method further includes generating a feedback magnetic field by driving a feedback current in a feedback conductor, the feedback magnetic field having a first feedback coupling factor with respect to the at least one first magnetic field sensing element and a second feedback coupling factor with respect to the at least one second magnetic field sensing element and the first feedback coupling factor is different than the second feedback coupling factor. The method further comprises generating the feedback current for coupling to the feedback conductor based on the direct magnetic field and the feedback magnetic field and sensing the feedback current.

The method may include comparing a first signal from the at least one first magnetic field sensing element to a second signal from the at least one second magnetic field sensing element. A ratio of the first direct coupling factor to the first feedback coupling factor can be approximately equal to a ratio of the second direct coupling factor to the second feedback coupling factor. In some embodiments, the different between the first signal and the second signal can be driven to zero by modifying properties of the feedback conductor.

In some embodiments, a first portion of the feedback conductor is disposed proximate to the at least one first magnetic field sensing element and a second portion of the feedback conductor is disposed proximate to the at least one second magnetic field sensing element. The first portion can be formed having a first number of turns and the second portion can be formed having a second, different number of turns such that the first number of turns corresponds to the first feedback coupling factor and wherein the second number of turns corresponds to the second feedback coupling factor.

The first portion can be formed having a first width and the second portion can be formed having a second, different width, wherein the first width corresponds to the first feedback coupling factor and the second width corresponds to the second feedback coupling factor. It should be appreciated that various properties of the first and second portion can be modified to generate a desired coupling factor, such as but not limited to a number of turns, a thickness of the turns, and/or a positioning of the turns with respect to one or more magnetic field sensing elements.

In some embodiments, the second feedback coupling factor can be substantially null.

A configuration of the feedback conductor can be modified to modify one or both of the first feedback coupling factor and the second feedback coupling factor. In some embodiments, the method may include generating one or both of the first feedback coupling factor at a first level and the second feedback coupling factor at a second level based on the configuration of the feedback conductor.

In another aspect, a current sensor for sensing a direct magnetic field generated by a current through a conductor is provided. The current sensor includes at least one first magnetic field sensing means spaced from at least one second magnetic field sensing means for detecting the direct magnetic field such that the at least one first magnetic field sensing means and the at least one second magnetic field sensing means are configured to sense the direct magnetic field at different magnitudes. The direct magnetic field has a first direct coupling factor with respect to the at least one first magnetic field sensing means and a second direct coupling factor with respect to the at least one second magnetic field sensing means. The current sensor further includes means for carrying a feedback current to generate a feedback magnetic field. The feedback current carrying means has a first feedback coupling factor with respect to the at least one first magnetic field sensing means and a second feedback coupling factor with respect to the at least one second magnetic field sensing means. In an embodiment, the first feedback coupling factor is different than the second feedback coupling factor. The current sensor further includes means coupled to the plurality of magnetic field sensing means for generating the feedback current based on the direct magnetic field and the feedback magnetic field and means for sensing the feedback current.

The feedback current carrying means can include a first portion disposed proximate to the at least one first magnetic field sensing means and a second portion disposed proximate to the at least one second magnetic field sensing means. The first portion can have a first number of turns corresponding to the first feedback coupling factor and the second portion can have a second, different number of turns corresponding to the second feedback coupling factor.

The first portion may have a first width corresponding to the first feedback coupling factor and the second portion may have a second, different width corresponding to the second feedback coupling factor. The first feedback coupling factor can correspond to a first distance between the feedback current carrying means and the at least one first magnetic field sensing means and the second feedback coupling factor can correspond to a second distance between the feedback current carrying means and the at least one second magnetic field sensing means.

In some embodiments, the second feedback coupling factor can be substantially null.

The current sensor may include means for switching coupled to the feedback current carrying means and configured to modify one or both of the first feedback coupling factor and the second feedback coupling factor.

BRIEF DESCRIPTION OF THE DRAWINGS

The foregoing features may be more fully understood from the following description of the drawings in which:

FIG. 2 illustrates a primary conductor and feedback conductor disposed proximate to two sets of magnetic field sensing elements, the direct coupling factors between the primary conductor and the sensing elements and the feedback coupling factors between the feedback conductor and the sensing elements;

FIG. 2A is a circuit diagram of a bridge configuration of the magnetic field sensing elements of FIG. 2;

DETAILED DESCRIPTION

Before describing the present invention, some introductory concepts and terminology are explained.

As used herein, the term "magnetic field sensing element" is used to describe a variety of electronic elements that can sense a magnetic field. The magnetic field sensing element can be, but is not limited to, a Hall-effect element, a magnetoresistance element, or a magnetotransistor. As is known, there are different types of Hall-effect elements, for example, a planar Hall element, a vertical Hall element, and a Circular Vertical Hall (CVH) element. As is also known, there are different types of magnetoresistance elements, for example, a semiconductor magnetoresistance element such as an Indium Antimonide (InSb) element, a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensing circuit" is used to describe a circuit that uses a magnetic field sensing element, generally in combination with other circuits. Magnetic field sensing circuits are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figure 1:
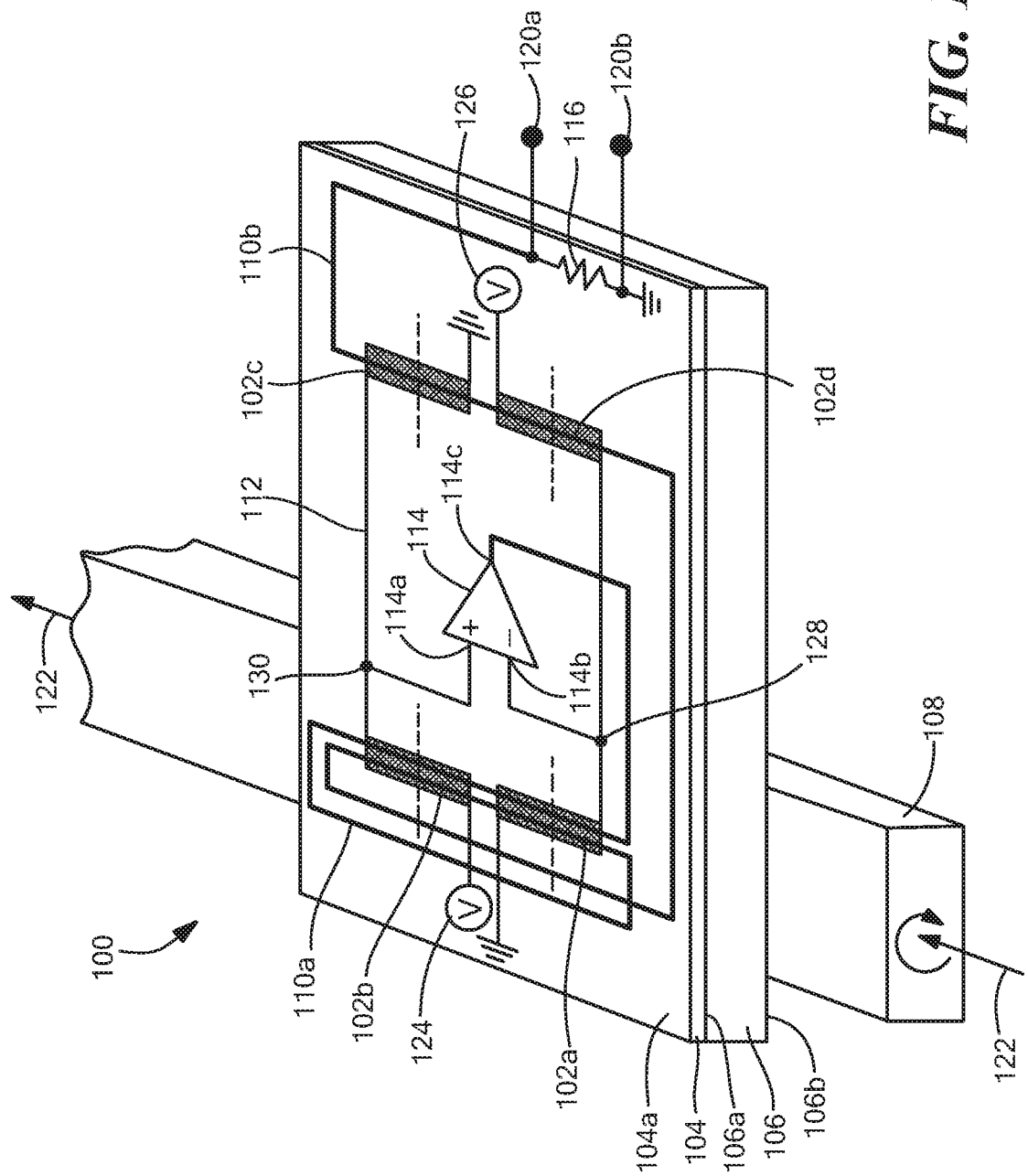
FIG. 1 shows a closed loop current sensor in which the feedback conductor includes a first coil proximate to first magnetic field sensing elements and a second coil proximate to second magnetic field sensing elements.

Now referring to FIG. 1, a current sensor 100 includes a plurality of magnetic field sensing elements 102a, 102b, 102c, 102d and a circuit 112 supported by a substrate 104. The plurality of sensing elements includes at least one first sensing element (here elements 102a, 102b) and at least one second sensing element (here elements 102c, 102d) spaced from the at least one first sensing element. A feedback conductor 110 is also supported by the substrate 104 and includes a first portion 110a and a second portion 110b. In the illustrative embodiment of FIG. 1, first portion 110a is disposed proximate to first and second magnetic field sensing elements 102a, 102b and second portion 110b is disposed proximate to third and fourth magnetic field sensing elements 102c, 102d.

Circuit 112 can include a differential amplifier 114 and magnetic field sensing elements 102a, 102b, 102c, 102d are coupled to circuit 112 such that a first input 114a of differential amplifier 114 is coupled to a node 130 between magnetic field sensing elements 102b, 102c and a second input 114b of differential amplifier 114 is coupled to a node 128 between magnetic field sensing elements 102a, 102d. An output 114c of differential amplifier 114 is coupled to feedback conductor 110. In an embodiment, a feedback current is provided to feedback conductor 110 by amplifier output 114c, as will be discussed in greater detail below.

A sense element 116 is coupled to feedback conductor 110 to generate an output voltage of the current sensor across output terminals 120a, 120b. The sensor output voltage is indicative of the feedback current.

Substrate 104 is disposed on or proximate to a first surface 106a of a dielectric 106. A conductor 108 is disposed proximate to a second surface 106b of dielectric 106, so that the conductor 108 is isolated from substrate 104 by the dielectric 106. Conductor 108 is configured to carry a current 122 to be sensed by the current sensor 100. Conductor 108 may be referred to as a primary conductor.

In operation, current 122 flows through primary conductor 108 generating a direct magnetic field that can be sensed by first, second, third and fourth magnetic field sensing elements 102a, 102b, 102c, 102d at different magnitudes. For example, because of their close proximity to conductor 108, first and second magnetic field sensing elements 102a, 102b can sense the direct magnetic field at a first magnitude and because of their further distance from conductor 108, third and fourth magnetic field sensing elements 102c, 102d can sense the direct magnetic field at a second, different magnitude, lower than the magnetic field magnitude sensed by elements 102a, 102b. Thus, primary conductor 108 has a first direct coupling factor with respect to first and second magnetic field sensing elements 102a, 102b and a second direct coupling factor with respect to third and fourth magnetic field sensing elements 102c, 102d, which second direct coupling factor may be lower than the first direct coupling factor. Current sensing with such a configuration of spaced sensing elements with one or more first elements closer to the primary conductor than one or more second elements can be referred to as gradient current sensing.

A first voltage source 124 coupled to second and third magnetic field sensing elements 102b, 102c generates a first voltage at node 130 having a magnitude related to the resistance of the magnetic field sensing elements 102b, 102c. A second voltage source 126 coupled to first and fourth magnetic field sensing elements 102a, 102d and generates a second voltage at node 128 having a magnitude related to the resistance of the sensing field sensed by elements 102a, 102d. In some embodiments, first and second voltage sources 124, 126 may provide the same voltage. For example, in one embodiment, first and second voltage sources 124, 126 may be a single voltage source. In other embodiments, first and second voltage sources 124, 126 may be different and provide different voltages.

Amplifier 114 (e.g., differential amplifier) is coupled to first, second, third, and fourth magnetic field sensing elements 102a, 102b, 102c, 102d and generates the feedback current provided to feedback conductor 110. For example, first input 114a can be coupled to node 130 and second input 114b can be coupled to node 128. Amplifier 114 can generate the feedback current at its output 114c at a level based on a voltage difference between the voltages at first and second nodes 130, 128 and provide the feedback current to feedback conductor 110.

First portion 110a of feedback conductor 110 is proximate to first and second magnetic field sensing elements 102a, 102b and provides a first feedback coupling factor to first and second magnetic field sensing elements 102a, 102b. For example, the first feedback coupling factor can be configured to bring the total magnetic field experienced by sensing elements 102a, 102b to approximately a zero magnetic field level (or to some other desired magnetic field level or equilibrium point). To achieve this goal, the first feedback coupling factor can be selected or designed based at least in part on the expected direct magnetic field experienced by sensing elements 102a, 102b.

Second portion 110b of feedback conductor 110 is proximate to third and fourth magnetic field sensing elements 102c, 102d and provides a second feedback coupling factor to third and fourth magnetic field sensing elements 102c, 102d. The second feedback coupling factor can be configured to bring the total magnetic field experienced by sensing elements 102c, 102d approximately a zero magnetic field level (or to some other desired magnetic field level or equilibrium point). Here again, to achieve this goal, the second feedback coupling factor can be selected or designed based at least in part on the expected direct magnetic field experienced by sensing elements 102c, 102d.

More particularly, first and second feedback coupling factors can be selected and/or modified based at least in part on an expected difference in the direct magnetic field sensed by first and second magnetic field sensing elements 102a, 102b as compared with third and fourth magnetic field sensing elements 102c, 102d. For example, in the illustrative embodiment of FIG. 1, first and second magnetic fields sensing elements 102a, 102b are positioned substantially over primary conductor 108 and third and fourth magnetic field sensing elements 102c, 102d are not disposed over primary conductor 108 and spaced from first and second magnetic field sensing elements 102a, 102b. Thus, third and fourth magnetic field sensing elements 102c, 10d may sense the direct magnetic field generated by current 122 through conductor 108 at a different (e.g., lower) level than first and second magnetic field sensing elements 102a, 102b. Therefore, the first and second feedback coupling factors can be selected and/or modified based on this difference in order to thereby bring the resulting magnetic field experienced by the first, second, third and/or fourth magnetic field sensing elements 102a, 102b, 102c, 102d to near or approximately at a zero magnetic field level or some other desired equilibrium point. Note also that by operation of the closed looped system, the difference between the magnetic field experienced by the second and third elements 102b, 102c (i.e., the voltage at node 130) and the magnetic field experienced by the first and fourth elements 102a, 102d (i.e., the voltage at node 128) can be brought to approximately zero.

It should be appreciated that various structures and techniques can be used to vary the feedback coupling factors, such as different properties of the first and second portions 110a, 110b. For example, in the illustrative embodiment of FIG. 1, first portion 110a includes at least two turns proximate to first and second magnetic field sensing elements 102a, 102b and second portion 110b includes one turn and is provided in the form of a single direction current path proximate to third and fourth magnetic field sensing elements 102c, 102d. Therefore, in the illustrative embodiment of FIG. 1, first portion 110a may provide a greater first feedback coupling factor (e.g., greater feedback magnetic field) as compared to the second feedback coupling factor provided by second portion 110b.

It should be appreciated that although FIG. 1 illustrates primary conductor 108 disposed generally proximate to (here under) first and second magnetic field sensing elements 102a, 102b, in other embodiments, primary conductor 108 may be disposed generally proximate to third and fourth magnetic field sensing elements 102c, 102d.

In some embodiments, a width of first and/or second feedback conductor portions 110a, 110b can be modified to make a resistance value of first and second portions 110a, 110b equal or substantially equal. For example, a width of second portion 110b can be made smaller (e.g., thinner) than a width of first portion 110a to make the resistance value of each of first and second portions 110a, 110b equal. In some embodiments, the resistance value of each of first and second portions 110a, 110b can be made equal or substantially equal so that first and second portions 110a, 110b dissipate equal or substantially equal power, thus keeping the heating of the magnetic field sensing elements 102a, 102b, 102c, 102d uniform.

Magnetic field sensing elements 102a, 102b, 102c, 102d may include one or more of magnetoresistance elements or Hall effect elements. The one or more magnetoresistance elements may include at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

Substrate 104 may include a semiconductor substrate. In some embodiments, substrate 104 may include a semiconductor material or any material used for supporting semiconductor materials. For example, substrate 104 may include, but is not limited to, a semiconductor material disposed on at least one of glass, ceramic, or polymer.

The properties and/or dimensions of dielectric 106 can be selected to provide a desired electrical isolation of substrate 104 from conductor 108. In some embodiments, dielectric 106 may include a circuit board.

Figure 1A:
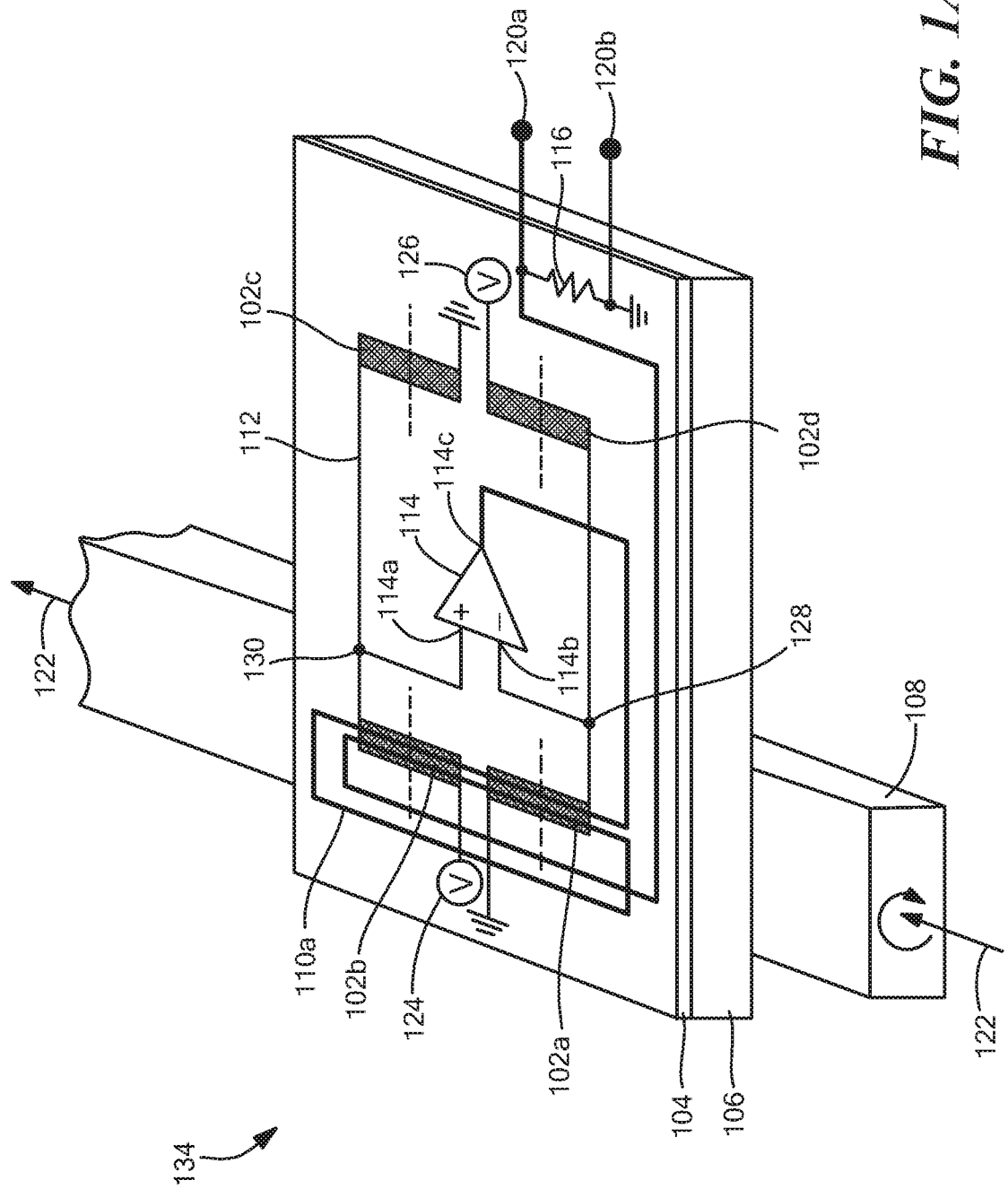
FIG. 1A shows a closed loop current sensor in which the feedback conductor includes a coil proximate to first magnetic field sensing elements.

Referring now to FIG. 1A, in which like reference numerals refer to like elements, a current sensor 134 includes an alternative feedback conductor 110 having one portion, here first portion 110a disposed proximate to first and second magnetic sensing element 102a, 102b. Thus, in the illustrative embodiment of FIG. 1A, no portion of feedback conductor 110 is disposed proximate to third and fourth magnetic field sensing elements 102c, 102d.

In this embodiment, the feedback coupling factor from feedback conductor 110 to third and fourth magnetic sensing elements 102c, 102d may be less than the feedback coupling factor from feedback conductor 110 to first and second magnetic sensing elements 102a, 102b. For example, the feedback coupling factor to third and fourth magnetic sensing elements 102c, 102d may be approximately zero or substantially close to zero (e.g., substantially null).

In operation, current 122 flows through conductor 108, generating the direct magnetic field that is sensed by first, second, third and fourth magnetic field sensing elements 102a, 102b, 102c, 102d at different magnitudes. First voltage source 124 coupled to second and third magnetic field sensing elements 102b, 102c generates a first voltage at node 130 having a magnitude related to the resistance of the second and third magnetic field sensing elements 102b, 102c. Second voltage source 126 coupled to first and fourth magnetic field sensing elements 102a, 102d generates a second voltage at node 128 having a magnitude related to the resistance of the first and fourth magnetic field sensing elements 102a, 102d. In some embodiments, first and second voltage sources 124, 126 may provide the same voltage and thus be approximately equal.

Amplifier 114 (e.g., differential amplifier) is coupled to first, second, third, and fourth magnetic field sensing elements 102, 102b, 102c, 102d to generate the feedback current provided to feedback conductor 110. For example, first input 114a can be coupled to node 130 and second input 114b can be coupled to node 128. Amplifier 114 can generate the feedback current at its output 114c at a level based on a voltage difference between the voltage at node 128 and the voltage at node 130 and provide the feedback current to feedback conductor 110.

First portion 110a of feedback conductor 110 is proximate to first and second magnetic field sensing elements 102a, 102b and provides the first feedback coupling factor to first and second magnetic field sensing elements 102a, 102b. The first feedback coupling factor can be configured to bring the total magnetic field experienced by sensing elements 102a, 102b to approximately the same level or substantially the same level as that experienced by sensing elements 102c and 102d In an embodiment, third and/or fourth magnetic field sensing elements 102c, 102d are spaced from first portion 110a of feedback conductor 110 such that the third and fourth magnetic field sensing elements 102c, 102d may not be affected (or may be only minimally affected) by the magnetic field generated by the feedback current (i.e., the feedback coupling factor to magnetic field sensing elements 102c, 102d is substantially null). However, as third and fourth magnetic field sensing elements 102c, 102d spaced from primary conductor 108, the direct magnetic field sensed by third and fourth magnetic field sensing elements 102c, 102d may be approximately zero or substantially close to zero (e.g., substantially null). Thus, in this example embodiment, both the second feedback, coupling factor and the second direct coupling factor are substantially null.

Figure 1B:
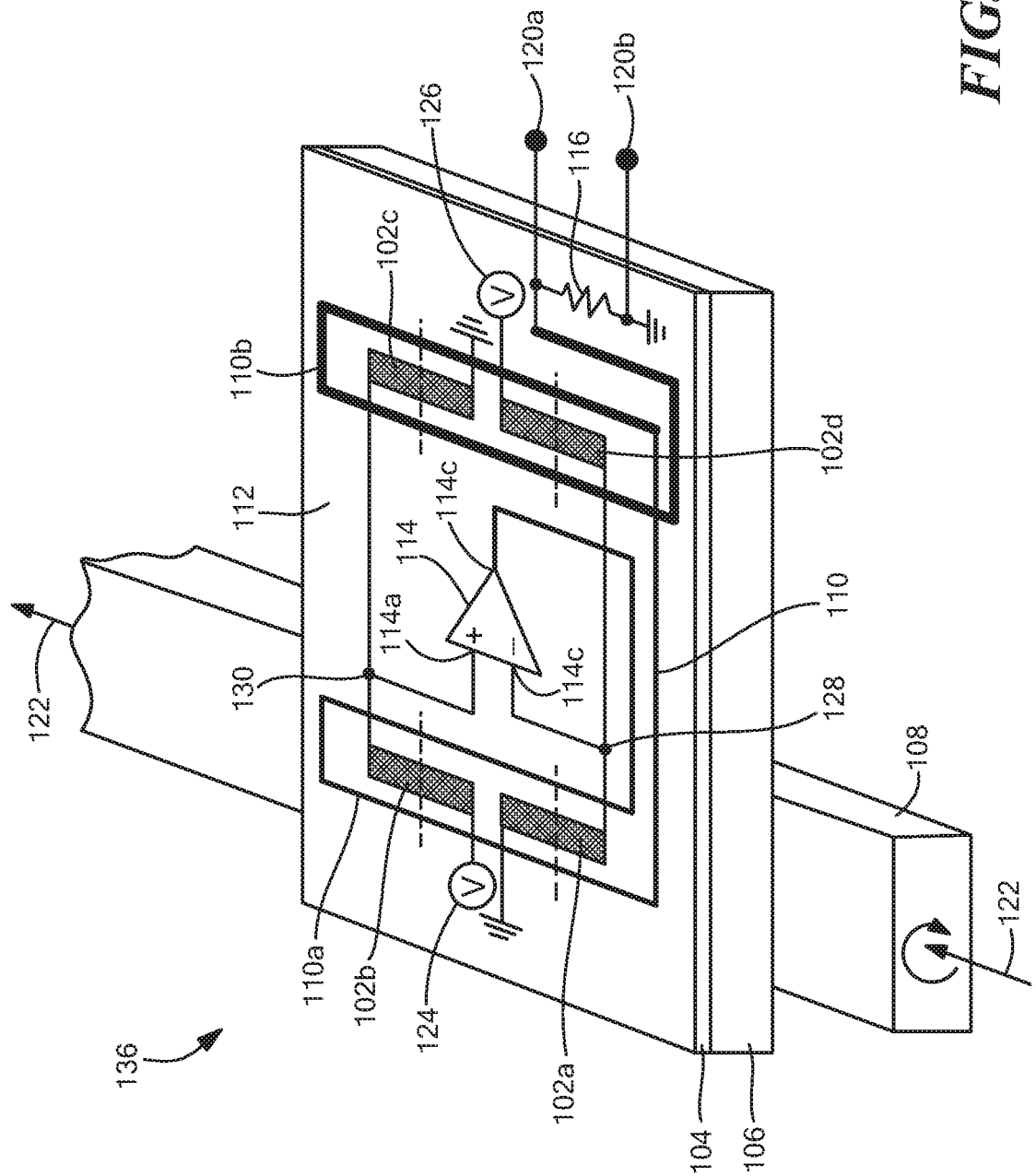
FIG. 1B shows a closed loop current sensor in which the feedback conductor includes a first coil proximate to first magnetic field sensing elements and a second coil proximate to second magnetic field sensing elements, where the first and second coils have the same number of turns but different widths.

Now referring to FIG. 1B, in which like reference numerals refer to like elements, a current sensor 136 includes an alternative feedback conductor 110 having first portion 110a proximate to first and second magnetic field sensing elements 102a, 102b and second portion 110b proximate to third and fourth magnetic field sensing elements 102c, 102d. In the illustrative embodiment of FIG. 1B, first portion 110a and second portion 110b include the same number of turns proximate to first and second magnetic field sensing elements 102a, 102b and third and fourth magnetic field sensing elements 102c, 102d, respectively. However, first and second portions 110a, 110b can be configured to provide different feedback coupling factors due to differences in their respective dimensions (e.g., widths, thickness).

For example, first portion 110a has a first width and a second portion 110b has a second, different width. The difference in width results in a difference coupling factor value for the respective portions (narrower for higher coupling, wider for lower coupling). Thus, first portion 102a can generate a first feedback magnetic field corresponding to the first width and second portion 102b can generate a second, different feedback magnetic field corresponding to the second width.

In operation, first portion 110a of feedback conductor 110 can include a single turn and be proximate to first and second magnetic field sensing elements 102a, 102b to provide the first feedback coupling factor to first and second magnetic field sensing elements 102a, 102b. A level of the first feedback coupling factor can correspond to the first width of first portion 110a. Second portion 110b of feedback conductor 110 can include a single turn and be proximate to third and fourth magnetic field sensing elements 102c, 102d to provide the second feedback coupling factor to third and fourth magnetic field sensing elements 102c, 102d. A level of the second feedback coupling factor can correspond to the second width of second portion 110b. In some embodiments, the level of the second feedback coupling factor can be inversely proportional to the second width of the second portion 110b.

Thus, first and second portions 110a, 110b include the same number of turns but provide feedback coupling factors at different levels based at least in part on a difference in the dimensions and/or properties of the materials making up first and/or second portions 110a, 110b of feedback conductor 110. In some embodiments, the first width can be greater than the second width. In other embodiments, the first width can be less than the second width.

Figure 1C:
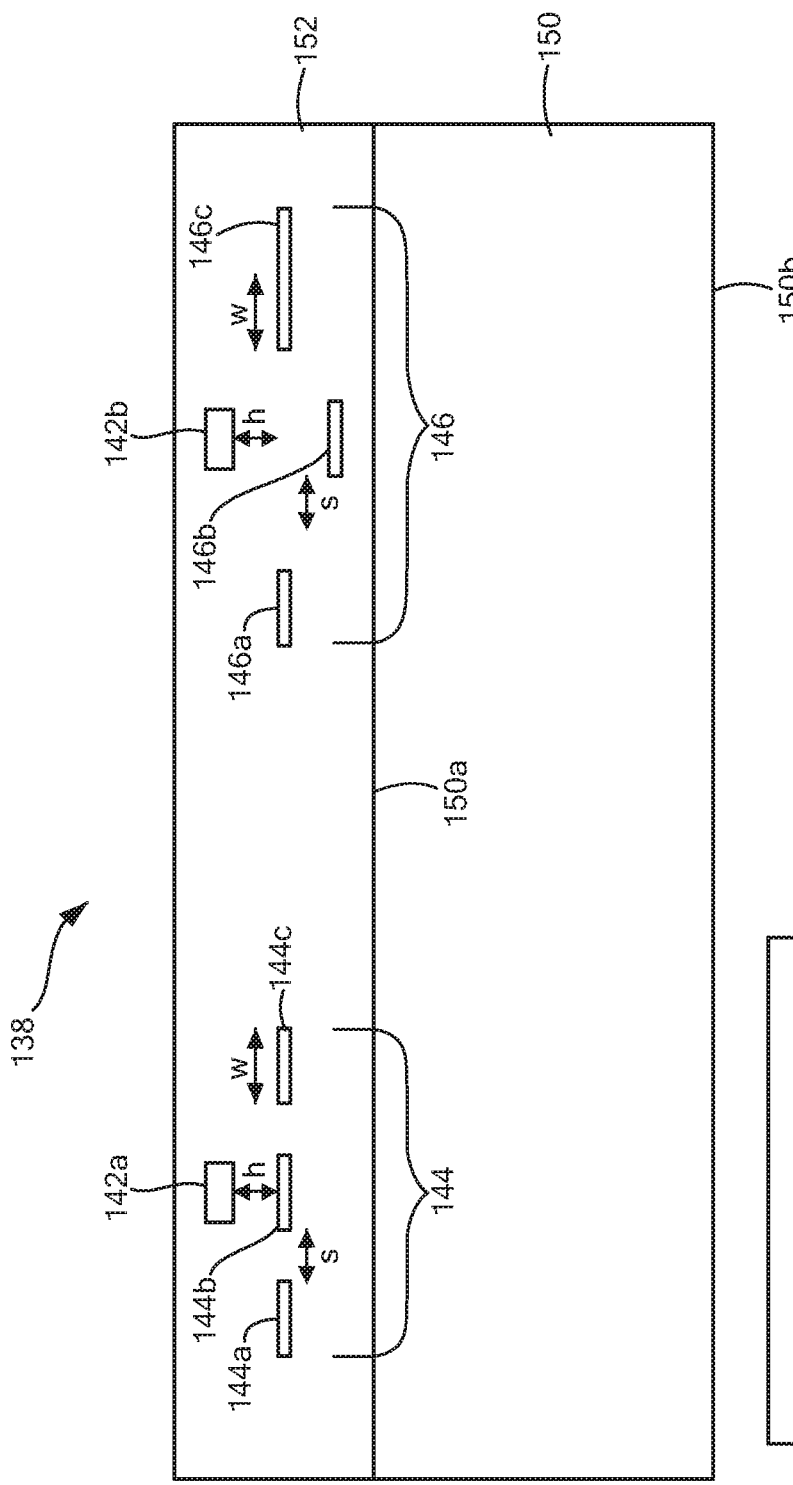
FIG. 1C is a view of a closed loop current sensor illustrating different feedback conductor parameters that can be varied to vary the feedback coupling to the magnetic field sensing elements.

Referring now to FIG. 1C, a current sensor 138 includes a first magnetic sensing element 142a is disposed proximate to a first portion 144 of a feedback conductor including turns 144a, 144b, 144c and a second magnetic sensing element 142b disposed proximate to second portion 146 of the feedback conductor including turns 146a, 146b, 146c. The cross-sectional view of FIG. 1C illustrates several parameters of the feedback conductor that can be varied to thereby vary the feedback coupling to the respective magnetic field sensing elements.

Each of first and second magnetic field sensing elements 142a, 142b and turns can be supported by a substrate 152. Substrate 152 is supported by a first surface 150a of dielectric 150. A primary conductor 148 can be disposed proximate to a second surface 150b of dielectric 150.

First and second magnetic field sensing elements 142a, 142b may be the same as or substantially similar to first, second, third, and fourth magnetic field sensing elements 102a, 102b, 102c, 102d of FIG. 1. First turn 144a, second turn 144b, third turn 144c, fourth turn 146a, a fifth turn 146b and a sixth turn 146c can be the same as or substantiality similar to portions of feedback conductor 110 of FIG. 1. Thus, turns 144a, 144b, 144c, 146a, 146b, 146c can be configured to generate a feedback magnetic field that is sensed by first and second magnetic field sensing elements 142a, 142b providing one or more different feedback coupling factors.

In an embodiment, the positioning of each of the turns 144a, 144b, 144c, 146a, 146b, 146c relative to each other (i.e., a dimension labeled 's') and relative to first and second magnetic field sensing elements 142a, 142b (i.e. a dimension labeled 'h') can be selected or otherwise modified to change a respective feedback coupling to the first and second magnetic field sensing elements 142a, 142b. The dimension 'h' can be varied by using different metal layers within the substrate 152 to form the feedback conductor portions 144, 146. It will be appreciated that feedback conductor portions including multiple turns require another metal layer to route connections. Thus, if only a single metal layer is available to form the feedback conductor, other dimensions such as 's' and 'w' can be altered to alter the resulting feedback coupling factors. Additionally or alternatively, a width of the respective turns (i.e. a dimension labeled 'w') can be selected to change the coupling factor.

The first and second feedback coupling factors can be selected and/or modified based at least in part on an expected difference in the direct magnetic field sensed by first magnetic field sensing elements 142a as compared with second magnetic field sensing element 142b. In an embodiment, at least one of or a combination of a spacing between the respective turns, a distance from the turns to the respective magnetic field sensing elements, and a width of the turns can be selected to bring the total magnetic field experienced by the first and second magnetic field sensing elements 142a, 142b to an equilibrium point that is near a zero magnetic field level or approximately a zero magnetic field level. Further, by operation of the closed loop system, the difference between the total magnetic field experienced by the first and second magnetic field sensing elements 142a, 142b is driven to approximately zero.

Figure 1D:
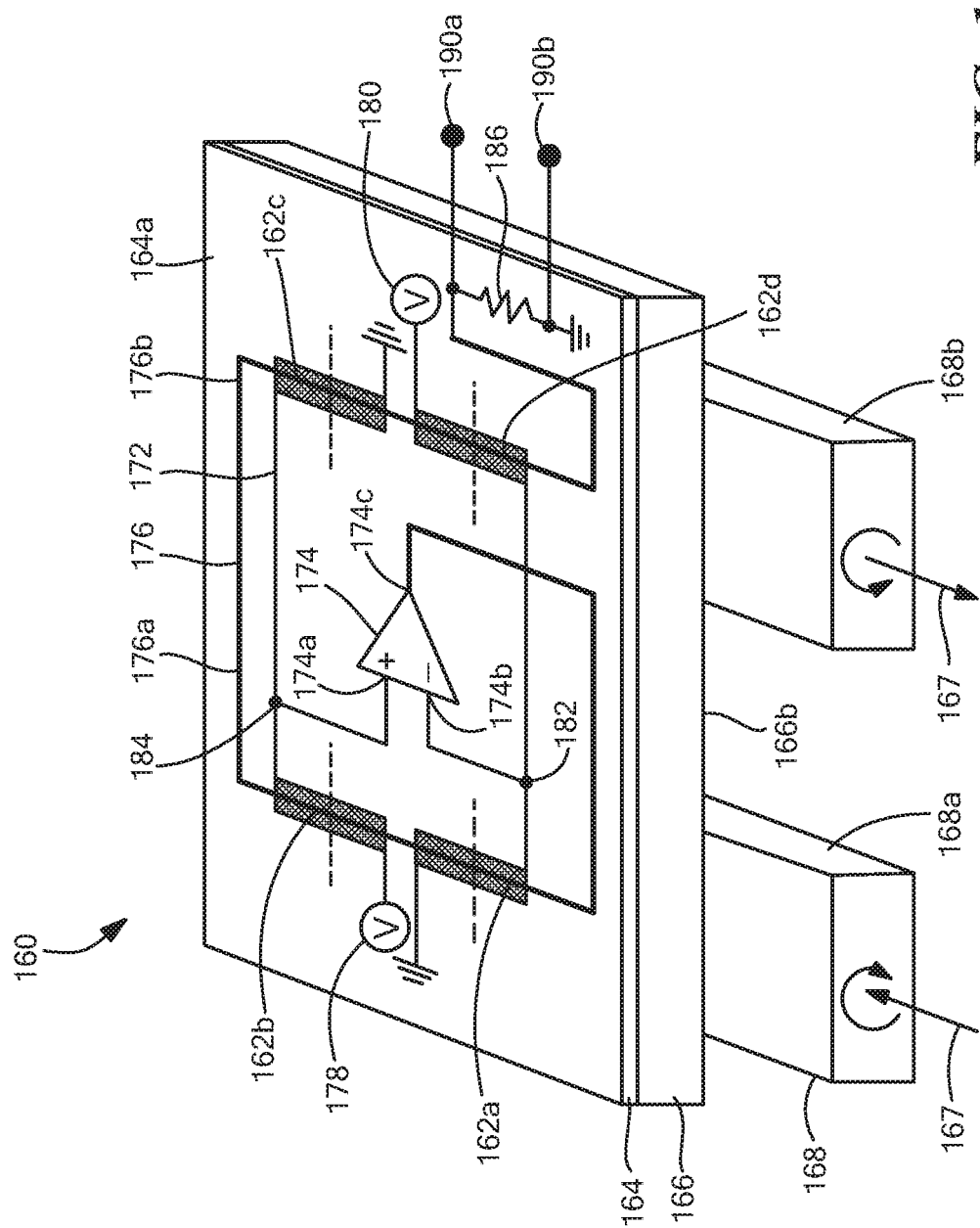
FIG. 1D shows a closed loop differential current sensor.

Now referring to FIG. 1D, a differential current sensor 160 includes a plurality of magnetic field sensing elements 162a, 162b, 162c, 162d and a circuit 172 supported by a first surface 164a of a substrate 164. Circuit 172 includes a differential amplifier 174 and magnetic field sensing elements 162a, 162b, 162c, 162d are coupled to circuit 172 such that a first input 174a of differential amplifier 174 is coupled to a node 184 between sensing elements 162b, 162c and a second input 174b of differential amplifier 174 is coupled to a node 182 between sensing elements 162a, 162d. An output 174c of differential amplifier 174 is coupled to feedback conductor 176 to provide a feedback current.

Current sensor 160 may be similar to current sensor 100 of FIG. 1, however current sensor 160 is configured to perform differential current sensing (as compared with sensing a gradient field like current sensor 100) in the sense that the magnetic field produced on a second magnetic field sensing element 162b by a primary conductor 168 and a feedback conductor 176 is opposite in polarity to that produced by the conductor on a first magnetic field sensing element 162a.

A sense element 186 is coupled to feedback conductor 176 to generate an output voltage of the current sensor across output terminals 190a, 190b. The sensor output voltage is indicative of the feedback current.

Substrate 164 is supported by a dielectric 166. Primary conductor 168 is disposed proximate to a second surface 166b of dielectric 166. Conductor 168 is configured to carry a current 167 to be sensed by the current sensor 160. In an embodiment, conductor 168 may be formed having a U-shape and thus, a first portion 168a may be disposed proximate to sensing elements 162a, 162b and a second portion 168b may be disposed proximate to sensing elements 162c, 162d with current flowing in opposite directions through first and second portions 168a, 168b.

In operation, current 167 flows through conductor 168 generating a direct magnetic field that is sensed by sensing elements 162a, 162b, 162c, 162d. For example, first and second magnetic field sensing elements 162a, 162b may sense the direct magnetic field in a first direction and at a first level (e.g., +B) and third and fourth magnetic field sensing elements 162c, 162d may sense the direct magnetic field in second, different direction and at a second level (e.g., −B).

A first voltage source 178, coupled to first current through second and third magnetic field sensing elements 162b, 162c, generates a first voltage at node 184 having a magnitude related to the resistance of magnetic field sensing elements 162b, 162c. A second voltage source 180, coupled to first and fourth magnetic field sensing elements 162a, 162d, generates a second voltage at node 182 having a magnitude related to the resistance of sensing elements 162a, 162d. In some embodiments, first and second voltage sources 178, 180 may provide the same voltage and thus be approximately equal. For example, in one embodiment, first and second voltage sources 178, 180 may be a single voltage source. In other embodiments, first and second voltage sources 178, 180 may be different and provide different voltages.

Amplifier 174 (e.g., differential amplifier) is coupled to first, second, third, and fourth magnetic field sensing elements 162a, 162b, 162c, 162d and generates the feedback current provided to feedback conductor 176. For example, first input 174a can be coupled to node 184 to provide the first voltage and second input 174b can be coupled to node 182. Amplifier 174 can generate the feedback current in response to a voltage difference between the voltages at nodes 182, 184 and provide the feedback current to feedback conductor 176 in order to bring the difference between the voltages at nodes 182, 184 to zero.

First portion 176a of feedback conductor 176 is proximate to first and second magnetic field sensing elements 162a, 162b and provides a first feedback coupling factor to first and second magnetic field sensing elements 162a, 162b. Second portion 176b of feedback conductor 176 is proximate to third and fourth magnetic field sensing elements 162c, 162d and provides a second feedback coupling factor to third and fourth magnetic field sensing elements 162c, 162d.

In the differential sensing embodiment of FIG. 1D, the first and second direct coupling factors from the primary conductor 168 to the magnetic field sensing elements 162a, 162b and to the magnetic field sensing elements 162c, 162d are the same since the primary conductor 168 is equally close to all of the sensing elements. Thus, if the magnetic field sensing elements 162a, 162b are perfectly matched with respect to elements 162c, 162d, then each such element should experience the same magnitude of direct magnetic field from the primary conductor 168, in which case a simple feedback conductor 176 could be used that provides the same feedback coupling factor (though opposite in polarity) to elements 162a, 162b as to elements 162c, 162d in order to thereby cause the total magnetic field experienced by each of the sensing elements 162a-162d to tend towards zero Gauss.

However, as will be appreciated, certain mismatches are possible, such as may be due to manufacturing processes and tolerances. As a result, magnetic field sensing elements 162a, 162b may experience a different magnitude of the direct magnetic field than magnetic field sensing elements 162c, 162d. In this situation, it may be desirable to alter the feedback conductor 176 in order to thereby alter the first feedback coupling factor to sensing elements 162a, 162b with respect to the second feedback coupling factor to sensing elements 162c, 162d. Such modification to the feedback conductor 176 to alter the feedback coupling factors can be achieved by varying the width of the feedback conductor portions 176a, 176b for example.

Referring to FIG. 2, a primary conductor 202 and a feedback conductor 204 are disposed proximate to a first set of magnetic field sensing elements 206 and a second set of magnetic field sensing elements 212. It should be appreciated that first set of magnetic field sensing elements 206, second set of magnetic field sensing elements 212, feedback conductor 204 and primary conductor 202 can be the same as or substantially similar to magnetic field sensing elements 102a, 102b, 102c, 102d, feedback conductor 110, and primary conductor 108, respectively of FIG. 1.

Conductor 202 can carry a current that generates a direct magnetic field sensed by first set of magnetic field sensing elements 206 and a second set of magnetic field sensing elements 212. In an embodiment, the direct magnetic field can have a first direct coupling factor 208a with respect to first set of magnetic field sensing elements 206 and second direct coupling factor 208b with respect to second set of magnetic field sensing elements 212.

Feedback conductor 204 can carry a feedback current that generates a feedback magnetic field sensed by first set of magnetic field sensing elements 206 and second set of magnetic field sensing elements 212. In an embodiment, the feedback magnetic field can have a first feedback coupling factor 210a with respect to first set of magnetic field sensing elements 206 and second feedback coupling factor 210b with respect to second set of magnetic field sensing elements 212.

Referring to FIG. 2A, a circuit representation of FIG. 2 is provided having first set of magnetic field sensing elements 206 and second set of magnetic field sensing elements 212 arranged in a bridge configuration, such as a Wheatstone bridge. In the illustrative embodiment of FIG. 2A, first set of magnetic field sensing elements 206 includes a first magnetic field sensing element 206a and a second magnetic field sensing element 206b and second set of magnetic field sensing elements 212 includes a first magnetic field sensing element 212a and a second magnetic field sensing element 212b.

In operation, a differential output signal of the bridge taken between a first intermediate node 214 and a second intermediate node 216 is provided to first and second inputs 220a, 220b respectively of amplifier 220. Amplifier 220 can be configured to generate a differential signal that rejects stray fields from sources other than the current through the primary conductor 202 and the feedback current through feedback conductor 204. In an embodiment, output 220c can provide a differential signal is indicative of the difference between the magnetic field sensed by each bridge leg.

In an embodiment, to have steady state operation of first, second, third and fourth magnetic field sensing elements 206a, 206b, 212a, 212b, a resistance value of each of first, second, third and fourth magnetic field sensing elements 206a, 206b, 212a, 212b should be equal. In some embodiments, resistance value of each of first and third magnetic field sensing elements 206a, 212a can be equal and resistance values of second and fourth magnetic field sensing elements 206b, 212b can be equal.

In the equations below, $R_1$ represents the resistance value of first magnetic field sensing element 206a, $R_2$ represents the resistance value of second magnetic field sensing element 206b, $R_3$ represents the resistance value of third magnetic field sensing element 212a, and $R_4$ represents the resistance value of fourth magnetic field sensing element 212b. Sigma ($\sigma$) represents the sensitivity of the elements in %/Gauss, $R_0$ represents the nominal resistance, $C_{D1}$, $C_{D2}$ represent the direct coupling factors in Gauss per Ampere, and $C_{f1}$ and $C_{f2}$ represent the feedback coupling factors in Gauss per Ampere. $I_{direct}$ represents the primary conductor 202 and $I_{fb}$ represents the current through feedback conductor 204.

The relationship between the resistance values of the magnetic field sensing elements 206a, 206b, 212a, and 212b can be represented as follows:

$$R_1 = R_2 = R_0 \times \sigma(I_{direct} \times C_{D1} + I_{fb} \times C_{f1})$$

$$R_3 = R_4 = R_0 \times \sigma(I_{direct} \times C_{D2} + I_{fb} \times C_{f2})$$

When $R_1 = R_2 = R_3 = R_4$ $$R_0 \times \sigma(I_{direct} \times C_{D1} + I_{fb} \times C_{f1}) = R_0 \times \sigma(I_{direct} \times C_{D2} + I_{fb} \times C_{f2})$$

$$(I_{direct} \times C_{D1} + I_{fb} \times C_{f1}) = (I_{direct} \times C_{D2} + I_{fb} \times C_{f2})$$

In an embodiment, ideally the magnetic field experienced by each of first, second, third and fourth magnetic field sensing elements 206a, 206b, 212a, 212b is approximately zero Gauss. Thus, $$(I_{direct} \times C_{D1} + I_{fb} \times C_{f1}) = (I_{direct} \times C_{D2} + I_{fb} \times C_{f2}) = 0$$

$$\frac{I_{direct}}{I_{fb}} = \frac{-C_{f1}}{C_{D1}} = \frac{-C_{f2}}{C_{D2}}$$

$$\frac{C_{f1}}{C_{D1}} = \frac{C_{f2}}{C_{D2}}$$

$$\frac{C_{f1}}{C_{f2}} = \frac{C_{D1}}{C_{D2}}$$

The feedback coupling factors due to the feedback current ($I_{fb}$) through feedback conductor 204 should be proportional to the direct coupling factors due to the current $I_{direct}$ through conductor 202 to have steady state operation of first, second, third and fourth magnetic field sensing elements 206a, 206b, 212a, 212b be at approximately zero field. For example, $C_{D1} = 2C_{D2}$, thus $C_{f1} = 2C_{f2}$.

Figure 2B:
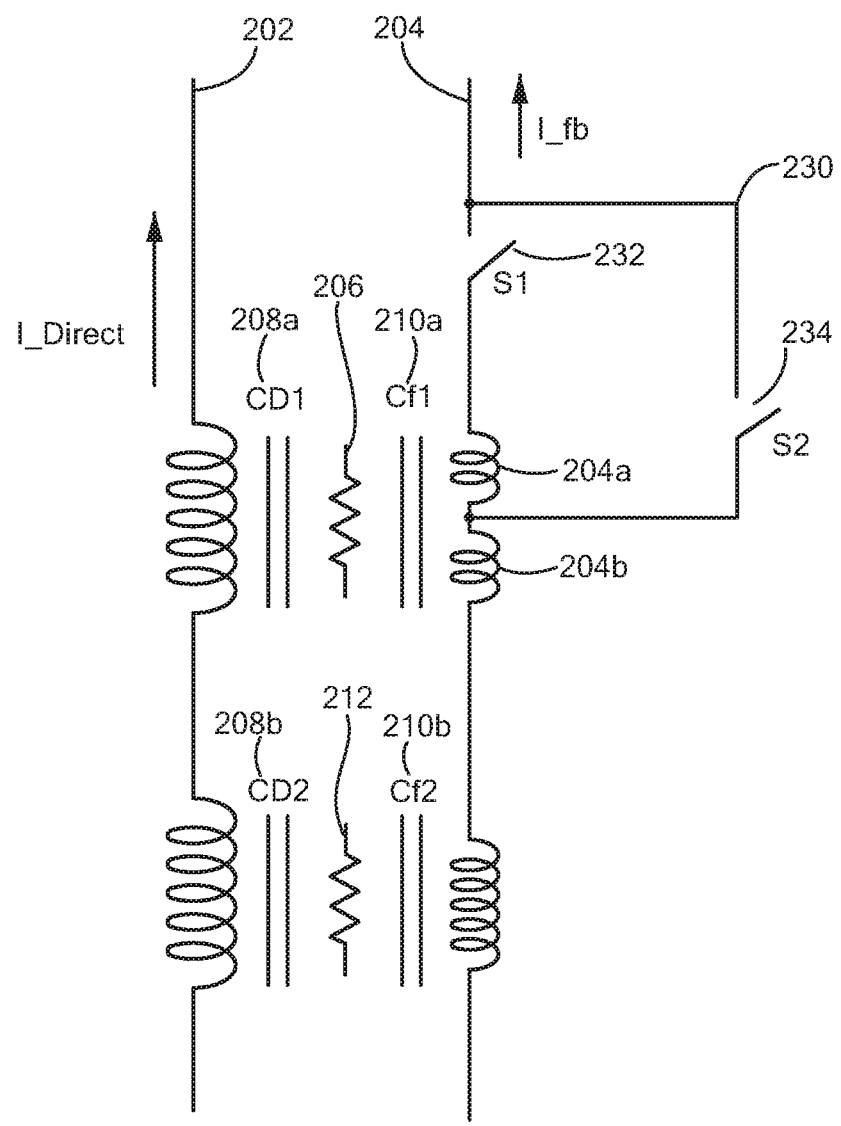
FIG. 2B illustrates a switching circuit coupled to the feedback conductor of FIG. 2.

Referring to FIG. 2B, a switching circuit 230 is coupled to feedback conductor 204. Switching circuit 230 includes a first switching element 232 and a second switching element 234 and is configured to modify one or more feedback coupling factors provided by feedback conductor 204. First and/or second switching elements 232, 234 can be opened or closed to generate a feedback magnetic field at a higher or lower level. For example, and as illustrated in FIG. 2B, first and second switching elements 232, 234 can be used to connect or disconnect different portions (e.g., turns, coils) of feedback conductor 204 to change a level of the feedback coupling factor provided by the respective portion. Table 1 is provided below to compare different switch positions of first and second switching elements 232, 234 and the impact on the feedback magnetic field magnitude.

TABLE 1

| S1 | S2 | Cf1 |
|---|---|---|
| Open | Closed | Lower Magnitude |
| Closed | Open | Higher Magnitude |

Referring to Table 1 above, first switching element 232 can be opened and second switching element 234 can be closed, thus disconnecting a first coil 204a of feedback conductor 204 and generate a feedback magnetic field at a first level. In such an embodiment, only second coil 204b would be proximate to first set of magnetic sensing elements 206, as first coil 204a is disconnected and no feedback current is provided to first coil 204a. Thus, the feedback coupling factor provided to the first set of magnetic field sensing elements 206 may be at a lower magnitude than if both first and second coils 204a, 204b were connected and generating a feedback magnetic field.

In other embodiments, first switching element 232 can be closed and second switching element 234 can be opened. Thus, first coil 204a is connected and provided the feedback current along with second coil 204b. In such an embodiment, the feedback coupling factor provided to the first set of magnetic field sensing elements 206 may be at a higher level than if only one of first or second coils 204a, 204b were connected and generating a feedback magnetic field.

It should be appreciated that FIG. 2B and Table 1 provide one embodiment of switching circuit 230 and that switching circuit 230 may be coupled to feedback conductor 204 in a variety of different ways to change or otherwise modify the feedback coupling factor provided by one or more portions of a feedback conductor. Although FIG. 2B shows switching circuit 230 having two switching elements, in other embodiments, switching circuit 230 may have a single switching element or more than two switching elements. Further, in some embodiments, multiple switching circuits 230 may be coupled to multiple points of feedback conductor 204.

Figure 3:
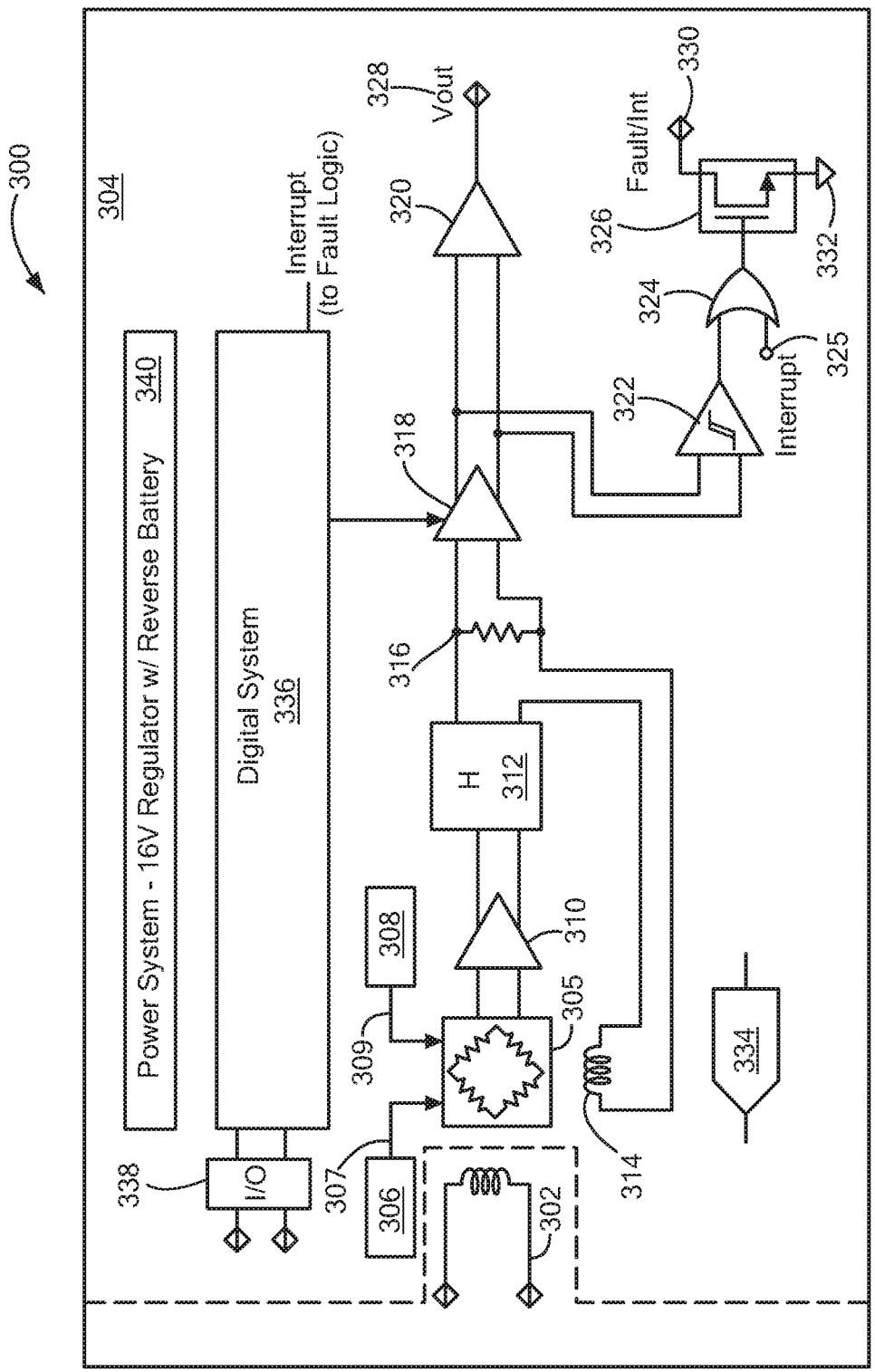
FIG. 3 is a circuit diagram of a closed loop current sensor.

Referring to FIG. 3, a current sensor system 300 includes a current sensor 304 and conductor 302. Current sensor 304 may be the same as, or substantially similar to current sensor 100 of FIG. 1. Current sensor 304 includes at least two spaced magnetic field sensing elements 305 and a controller circuit 336. Controller circuit 336 can generate various signals to control processing the output signals of magnetic field sensing elements 305 in order to thereby provide a current sensor output signal 328 indicative of a level of current through conductor 302. It should be appreciated that the output signals of the magnetic field sensing elements can be proportional to the current carried by conductor 302 and that the proportionality constant can be indicative of the distance between the respective magnetic field sensing elements of current sensor 304.

An input/output circuit (I/O) 338 coupled to controller 336 can control communication between current sensor 304 and various external devices or systems, such as an Engine Control Unit (ECU) in automotive applications of the current sensor system 300. For example, in some embodiments, I/O circuit 338 may include a clock (SCL) pin to receive a clock signal and a data (SDA) pin to receive and/or send a data signal. The current sensor system 300 may include a power module 340 to power circuitry within the sensor. For example, the power module 340 may include a regulator configured to receive power from a battery.

Current sensor 304 is positioned proximate to conductor 302 to sense a magnetic field generated by a current through conductor 302. To this end, current sensor 304 includes magnetic field sensing elements 305 responsive to a driver signal 307 from a bridge driver 306. In the example current sensor 304 of FIG. 3, magnetic field sensing elements 305 include four magnetoresistance elements coupled in a bridge configuration, such as a Wheatstone bridge. For example, magnetoresistance elements 305 may be coupled such that each leg of the bridge includes two magnetoresistance elements positioned adjacent to one another, with one such leg spaced from the other leg. For example, magnetoresistance elements 305 may be coupled such that each leg of the bridge includes two magnetoresistance elements positioned diagonal from each other to form each respective leg of the bridge or group of elements (e.g., element in left leg upper position and element in right leg lower position form a first bridge leg and element in left leg lower position and element in right leg upper position form a second bridge).

With this arrangement, a differential output signal of the bridge (taken between intermediate nodes of each bridge leg) may result in a differential signal that rejects stray fields from sources other than the current through the conductor 302. The magnetoresistance elements 305 may include at least one of at least one of an Indium Antimonide (InSb) element, a giant magnetoresistance (GMR) element, an anisotropic magnetoresistance (AMR) element, a tunneling magnetoresistance (TMR) element or a magnetic tunnel junction (MTJ) element. It should be appreciated that, in some embodiments, magnetic field sensing elements 305 may be provided as one or more Hall effect elements.

Controller circuit 336 can include or be coupled to a bridge trim circuit 308 configured to improve the accuracy of the current sensor output signal 328 by trimming the sensing elements of the bridge 305. For example, in the presence of a reference magnetic field (as may be applied during production), bridge trim circuit 308 can provide a trim signal 309 to magnetic field sensing elements 305 to trim the elements of the bridge 304 in order to thereby ensure that the sensitivity and offset of the individual elements and/or legs of the bridge is matched.

Magnetic field sensing elements 305 can generate a differential magnetic field signal for coupling to a first differential amplifier 310. One or more outputs of first amplifier 310 are coupled to one or more inputs of an H bridge circuit 312. H bridge circuit 312 can include multiple field effect transistors coupled together to compare two input signals and remove or reduce noise and/or interference (e.g., DC offset) and in some embodiments, apply a gain to the difference between the two input signals.

A feedback conductor 314 can be positioned proximate to magnetic field sensing elements 305 in order to apply an equal and opposite field to the sensing elements 305 and drive the differential field on the bridge to zero Gauss. The current through coil 314 necessary to bring the differential field on the sensing elements 305 to zero is sensed by a resistor 316 in order to thereby implement a closed loop current sensing system.

A voltage on the sense resistor 316 is coupled to further amplifiers 318 and 320 to implement offset and gain adjustment, including temperature compensation. An output terminal 328 of current sensor 304 (e.g., VOUT) can be provided at the output of amplifier 320 to provide a signal having a level indicative of the current through the conductor 302.

A differential comparator 322 can be provided to implement a fault detection feature. To this end, a logic gate 324 has a first input coupled to the output of comparator 322 and a second input coupled to an interrupt signal 325. In some embodiments, logic gate 324 may include an OR gate. An output of logic gate 324 is coupled to a control input of a transistor 326 such that detection of a current greater than a predetermined level causes a fault signal 330 to be provided. Current sensor 304 can include an analog-to-digital converter (ADC) 334 can be configured to monitor analog signals within current sensor 304 (e.g., analog references).

Figure 4:
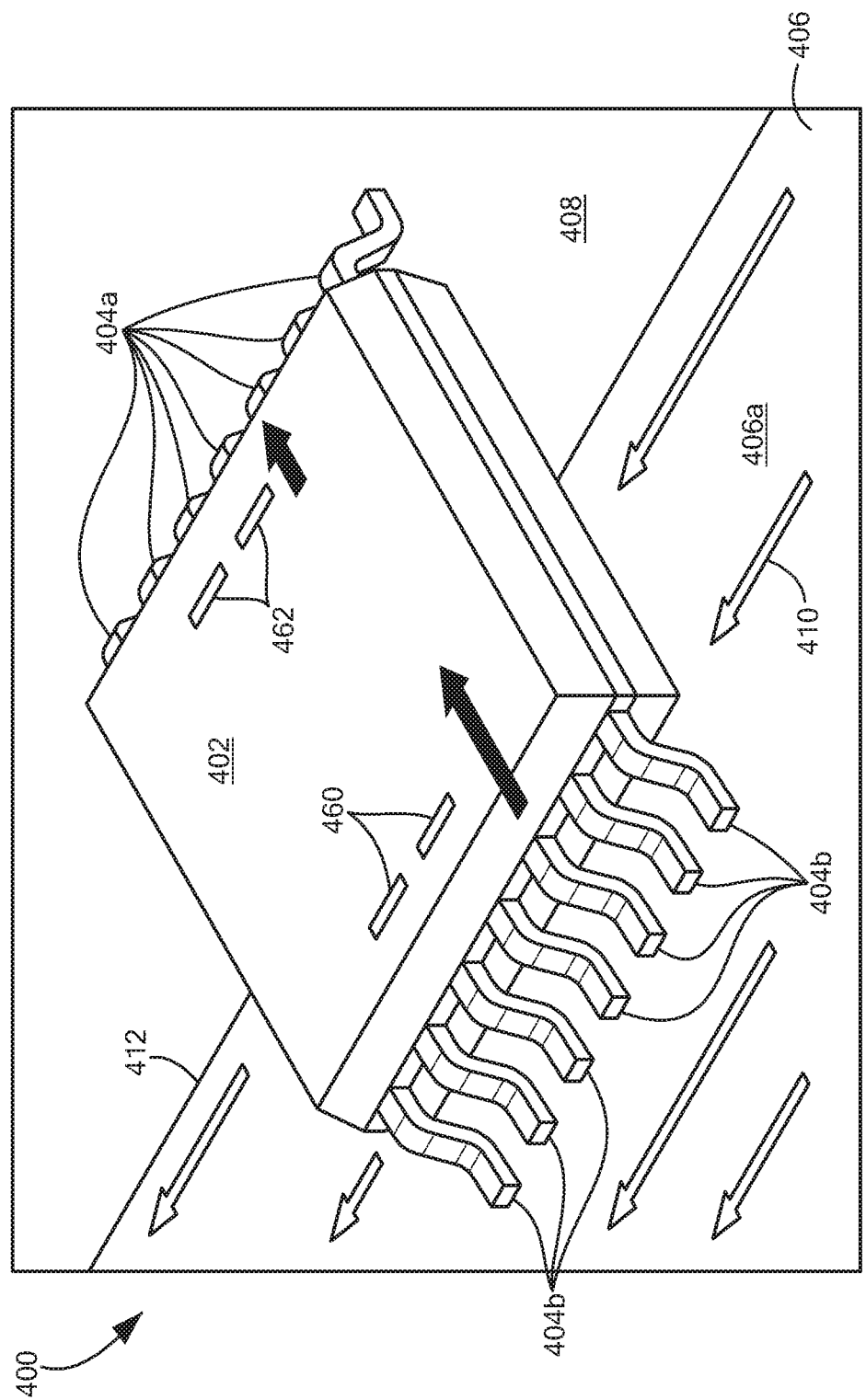
FIG. 4 shows a current sensor positioned over an edge of a primary conductor.

Referring to FIG. 4, a current sensor 400 is positioned over an edge 412 of external conductor 406 that is configured to carry a current 410. Current sensor 400 may be the same as or substantially similar to current sensor 100 of FIG. 1 and thus may include a plurality of magnetic field sensing elements configured to sense a magnetic field generated by the current 410 through conductor 406. In an embodiment, the plurality of magnetic field sensing elements can be oriented or otherwise positioned within current sensor 400 to sense the magnetic field generated by current 410 through conductor 406 in the same direction. In other words, the magnetic field sensing elements are positioned within the sensor package 402 such that when the sensor is disposed in proximity to (i.e., disposed over) the conductor 406, the magnetic field (generated by the current through the conductor) incident on each of the sensing elements has the same polarity.

As illustrated in FIG. 4, a first plurality of leads 404a of current sensor 400 are coupled to a non-current carrying surface 408 and a second plurality of leads 404b are coupled to conductor 406. Thus, current sensor 400 can be positioned over edge 412 of conductor 406, as shown. In some embodiments, leads 404a may be coupled to a die paddle within current sensor 402 and leads 404b may be spaced from (e.g., not in contact with) the die paddle within current sensor 402 as described in co-pending U.S. patent application Ser. No. 15/496,152, filed on Apr. 25, 2017, which is incorporated herein by reference in its entirety. Thus, current sensor 400 may provide high voltage isolation between leads 404a and conductor 406.

Current sensor 400 can be positioned over edge 412 of conductor 406 such that a first magnetic sensing element 460 is vertically aligned with (here over) conductor 406 and a second magnetic sensing element 462 is not vertically aligned with conductor 406 and instead is aligned with a non-current carrying surface 408 (i.e., with magnetic field sensing elements 460, 462 straddling the edge 412 of the conductor).

The position of current sensor package 402 relative to conductor 406 can be selected based at least in part on a level of the current through conductor 406 and thus, the expected direct magnetic field strength and/or the sensitivity of the magnetic field sensing elements. In some embodiments, it may be desirable to position the sensor 400 so that the sensing elements 460, 462 experience the largest magnetic field gradient possible (i.e., the largest difference between the magnetic fields experienced by the spaced magnetic field sensing elements 460, 462) as may occur when at least one first magnetic sensing element 460 is vertically aligned with the current carrying conductor 406 and at least one second magnetic sensing element 462 is not vertically aligned with the current carrying conductor 406. To this end, a first portion of current sensor 400 may be vertically aligned with (here over) conductor 406 and second portion may not be vertically aligned with conductor 402 and instead is vertically aligned with a non-current carrying surface 408. In one such configuration, current sensor 400 may be positioned such that an edge of the first portion and an edge of the second portion are equidistant from edge 412 of conductor 406 (and more specifically such that the sensing elements 460, 462 are equidistant from the conductor edge 412. Thus, the first portion and second portion can be equal in size (e.g., width, length).

In other embodiments, the first portion and the second portion of current sensor 402 may be different in size. For example, current sensor 402 may be positioned such a distance from edge 412 of conductor 406 to the edge of the first portion is greater than a distance from edge 412 of conductor 406 to the edge of the second portion. In other embodiments, current sensor 400 may be positioned such a distance from edge 412 of conductor 406 to the edge of the first portion is less than a distance from edge 412 of conductor 406 to the edge of the second portion. In such configurations, the magnetic field sensing elements 460, 462 may not be equidistantly spaced from the conductor edge 412.

In some embodiments, all of current sensor package 402 (or at least both magnetic field sensing elements 460, 462) may be vertically aligned (i.e., positioned over) conductor 406. In such embodiments, the sensing elements 460, 462 are not centered with respect to the conductor in order to ensure a gradient in the magnetic fields experienced by the sensing elements. In other embodiments, current sensor 400 can be positioned relative to conductor 406 such no portion (or at least neither magnetic field sensing element) is vertically aligned (i.e., positioned over) conductor 406 and instead current sensor 400 is vertically offset with respect to conductor 406.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed:

1. A current sensor for sensing a direct magnetic field generated by a current through a primary conductor comprising:
    a plurality of magnetic field sensing elements comprising at least one first magnetic field sensing element spaced from at least one second magnetic field sensing element, wherein the at least one first magnetic field sensing element and the at least one second magnetic field sensing element are configured to sense the direct magnetic field at different magnitudes, the direct magnetic field having a first direct coupling factor with respect to the at least one first magnetic field sensing element and a second direct coupling factor with respect to the at least one second magnetic field sensing element;
    a feedback conductor configured to carry a feedback current generating a feedback magnetic field, the feedback magnetic field having a first feedback coupling factor with respect to the at least one first magnetic field sensing element and a second feedback coupling factor with respect to the at least one second magnetic field sensing element, wherein the first feedback coupling factor is different than the second feedback coupling factor;
    a circuit coupled to the plurality of magnetic field sensing elements and configured to generate the feedback current for coupling to the feedback conductor based on the direct magnetic field and the feedback magnetic field; and
    a sense element coupled to the feedback conductor and configured to sense the feedback current.

2. The current sensor of claim 1, wherein the circuit comprises a differential amplifier having a first input coupled to the at least one first magnetic field sensing element, a second input coupled to the at least one second magnetic field sensing element, and an output at which the feedback current is provided.

3. The current sensor of claim 1, wherein the feedback conductor further comprises a first portion disposed proximate to the at least one first magnetic field sensing element and a second portion disposed proximate to the at least one second magnetic field sensing element.

4. The current sensor of claim 3, wherein the first portion has a first number of turns corresponding to the first feedback coupling factor and the second portion has a second, different number of turns corresponding to the second feedback coupling factor.

5. The current sensor of claim 3, wherein the first portion has a first width corresponding to the first feedback coupling factor and the second portion has a second, different width corresponding to the second feedback coupling factor.

6. The current sensor of claim 1, wherein the first feedback coupling factor corresponds to a first distance between the feedback conductor and the at least one first magnetic field sensing element and the second feedback coupling factor corresponds to a second distance between the feedback conductor and the at least one second magnetic field sensing element.

7. The current sensor of claim 1, wherein the second feedback coupling factor is substantially null.

8. The current sensor of claim 1, wherein a ratio of the first direct coupling factor to the first feedback coupling factor is approximately equal to a ratio of the second direct coupling factor to the second feedback coupling factor.

9. The current sensor of claim 1, further comprising a switching circuit coupled to the feedback conductor, the switching circuit configured to modify one or both of the first feedback coupling factor and the second feedback coupling factor.

10. The current sensor of claim 1, wherein the primary conductor is external to the current sensor.

11. The current sensor of claim 1, wherein the sense element comprises one or more resistive elements.

12. The current sensor of claim 1, wherein the plurality of magnetic field sensing elements comprise one or more of magnetoresistance elements or Hall effect elements.

13. The current sensor of claim 12, wherein the one or more magnetoresistance elements comprises at least one of Indium Antimonide (InSb), a giant magnetoresistance (GMR) element, an anisotropic magnetoresistance (AMR) element, a tunneling magnetoresistance (TMR) element or a magnetic tunnel junction (MTJ) element.

14. The current sensor of claim 3, wherein a resistance value of the first portion of the feedback conductor is approximately equal to a resistance value of the second portion of the feedback conductor.

15. A method for sensing a direct magnetic field generated by a current through a primary conductor comprising:

provinding a plurality of magnetic field sensing elements comprising at least one first magnetic field sensing element spaced from at least one second magnetic field sensing element, wherein the at least one first magnetic field sensing element and the at least one second magnetic field sensing element are configured to sense the direct magnetic field at different magnitudes, the direct magnetic field having a first direct coupling factor with respect to the at least one first magnetic field sensing element and a second direct coupling factor with respect to the at least one second magnetic field sensing element;

generating a feedback magnetic field by driving a feedback current in a feedback conductor, the feedback magnetic field having a first feedback coupling factor with respect to the at least one first magnetic field sensing element and a second feedback coupling factor with respect to the at least one second magnetic field sensing element, wherein the first feedback coupling factor is different than the second feedback coupling factor;

generating the feedback current for coupling to the feedback conductor based on the direct magnetic field and the feedback magnetic field; and sensing the feedback current.

16. The method of claim 15, wherein generating the feedback current further comprises comparing a first signal from the at least one first magnetic field sensing element to a second signal from the at least one second magnetic field sensing element.

17. The method of claim 15, wherein a ratio of the first direct coupling factor to the first feedback coupling factor is approximately equal to a ratio of the second direct coupling factor to the second feedback coupling factor.

18. The method of claim 15, further comprising providing a first portion of the feedback conductor proximate to the at least one first magnetic field sensing element and providing a second portion of the feedback conductor proximate to the at least one second magnetic field sensing element.

19. The method of claim 18, wherein providing the first portion of the feedback conductor further comprises forming the first portion having a first number of turns and providing the second portion of the feedback conductor comprises forming the second portion having a second, different number of turns, wherein the first number of turns corresponds to the first feedback coupling factor and wherein the second number of turns corresponds to the second feedback coupling factor.

20. The method of claim 18, wherein providing the first portion of the feedback conductor further comprises forming the first portion having a first width and providing the second portion of the feedback conductor comprises forming the second portion having a second, different width, wherein the first width corresponds to the first feedback coupling factor and wherein the second width corresponds to the second feedback coupling factor.

21. The method of claim 15, wherein the second feedback coupling factor is substantially null.

22. The method of claim 15, further comprising modifying a configuration of the feedback conductor to modify one or both of the first feedback coupling factor and the second feedback coupling factor.

23. The method of claim 15, further comprising generating one or both of the first feedback coupling factor at a first level and the second feedback coupling factor at a second level based on the configuration of the feedback conductor.

24. A current sensor for sensing a direct magnetic field generated by a current through a primary conductor comprising:

a plurality of magnetic field sensing means comprising at least one first magnetic field sensing means spaced from at least one second magnetic field sensing means for detecting the direct magnetic field, wherein the at least one first magnetic field sensing means and the at least one second magnetic field sensing means are configured to sense the direct magnetic field at different magnitudes, the direct magnetic field having a first direct coupling factor with respect to the at least one first magnetic field sensing means and a second direct coupling factor with respect to the at least one second magnetic field sensing means;

means for carrying a feedback current generating a feedback magnetic field, the feedback magnetic field having a first feedback coupling factor with respect to the at least one first magnetic field sensing and a second feedback coupling factor with respect to the at least one second magnetic field sensing means, wherein the first feedback coupling factor is different than the second feedback coupling factor;

means coupled to the plurality of magnetic field sensing means for generating the feedback current based on the direct magnetic field and the feedback magnetic field; and means for sensing the feedback current.

25. The current sensor of claim 24, wherein the feedback current carrying means comprises a first portion disposed proximate to the at least one first magnetic field sensing means and a second portion disposed proximate to the at least one second magnetic field sensing means.

26. The current sensor of claim 25, wherein the first portion has a first number of turns corresponding to the first feedback coupling factor and the second portion has a second, different number of turns corresponding to the second feedback coupling factor.

27. The current sensor of claim 25, wherein the first portion has a first width corresponding to the first feedback coupling factor and the second portion has a second, different width corresponding to the second feedback coupling factor.

28. The current sensor of claim 24, wherein the first feedback coupling factor corresponds to a first distance between the means for carrying the feedback current and the at least one first magnetic field sensing means and the second feedback coupling factor corresponds to a second distance between the means for carrying the feedback current and the at least one second magnetic field sensing means.

29. The current sensor of claim 24, wherein the second feedback coupling factor is substantially null.

30. The current sensor of claim 24, further comprising switching means coupled to the feedback current carrying means for modifying one or both of the first feedback coupling factor and the second feedback coupling factor.

31. The current sensor of claim 24, wherein a ratio of the first direct coupling factor to the first feedback coupling factor is approximately equal to a ratio of the second direct coupling factor to the second feedback coupling factor.

32. A current sensor for sensing a direct magnetic field generated by a current through a primary conductor comprising:

a plurality of magnetic field sensing elements comprising at least one first magnetic field sensing element spaced from at least one second magnetic field sensing element, wherein the at least one first magnetic field sensing element and the at least one second magnetic field sensing element are configured to sense the direct magnetic field at different magnitudes, the direct magnetic field having a first direct coupling factor with respect to the at least one first magnetic field sensing element and a second direct coupling factor with respect to the at least one second magnetic field sensing element;

a feedback conductor comprising a first portion having a first number of turns corresponding to a first feedback coupling factor associated with the at least one first magnetic field sensing element, and a second portion having a second, different number of turns corresponding to a second feedback coupling factor associated with the at least one second magnetic field sensing element, wherein the feedback conductor is configured to carry a feedback current generating a feedback magnetic field comprising the first feedback coupling factor and the second feedback coupling factor, wherein the first feedback coupling factor is different from the second feedback coupling factor;

a circuit coupled to the plurality of magnetic field sensing elements and configured to generate the feedback current for coupling to the feedback conductor based on the direct magnetic field and the feedback magnetic field; and a sense element coupled to the feedback conductor and configured to sense the feedback current.

33. A current sensor for sensing a direct magnetic field generated by a current through a primary conductor comprising:

a plurality of magnetic field sensing elements comprising at least one first magnetic field sensing element spaced from at least one second magnetic field sensing element, wherein the at least one first magnetic field sensing element and the at least one second magnetic field sensing element are configured to sense the direct magnetic field at different magnitudes, the direct magnetic field having a first direct coupling factor with respect to the at least one first magnetic field sensing element and a second direct coupling factor with respect to the at least one second magnetic field sensing element;

a feedback conductor comprising a first portion having a first width corresponding to a first feedback coupling factor associated with the at least one first magnetic field sensing element, and a second portion having a second, different width corresponding to a second feedback coupling factor associated with the at least one second magnetic field sensing element, wherein the feedback conductor is configured to carry a feedback current generating a feedback magnetic field comprising the first feedback coupling factor and the second feedback coupling factor, wherein the first feedback coupling factor is different from the second feedback coupling factor;

a circuit coupled to the plurality of magnetic field sensing elements and configured to generate the feedback current for coupling to the feedback conductor based on the direct magnetic field and the feedback magnetic field; and a sense element coupled to the feedback conductor and configured to sense the feedback current.

34. A current sensor for sensing a direct magnetic field generated by a current through a primary conductor comprising:

a plurality of magnetic field sensing elements comprising at least one first magnetic field sensing element spaced from at least one second magnetic field sensing element, wherein the at least one first magnetic field sensing element and the at least one second magnetic field sensing element are configured to sense the direct magnetic field at different magnitudes, the direct magnetic field having a first direct coupling factor with respect to the at least one first magnetic field sensing element and a second direct coupling factor with respect to the at least one second magnetic field sensing element;

a feedback conductor configured to carry a feedback current generating a feedback magnetic field, the feedback magnetic field having a first feedback coupling factor corresponding to a first distance between the feedback conductor and the at least one first magnetic field sensing element, and a second feedback coupling factor corresponding to a second distance between the feedback conductor and the at least one second magnetic field sensing element, wherein the first feedback coupling factor is different than the second feedback coupling factor and the first distance is different from the second distance;

a circuit coupled to the plurality of magnetic field sensing elements and configured to generate the feedback current for coupling to the feedback conductor based on the direct magnetic field and the feedback magnetic field; and a sense element coupled to the feedback conductor and configured to sense the feedback current.

* * * * *

UNITED STATES PATENT AND TRADEMARK OFFICE
CERTIFICATE OF CORRECTION

PATENT NO. : 10,557,873 B2
APPLICATION NO. : 15/653820
DATED : February 11, 2020
INVENTOR(S) : Alexander Latham Page 1 of 2

It is certified that error appears in the above-identified patent and that said Letters Patent is hereby corrected as shown below:

In the Specification

Column 4, Lines 58-59 delete "different" and replace with --difference--.

Column 6, Line 61 delete "element (AMR)" and replace with --(AMR) element--.

Column 8, Lines 27-28 delete "102d and generates" and replace with --102d generates--.

Column 8, Line 64 delete "102d approximately" and replace with --102d to approximately--.

Column 9, Line 9 delete "fields" and replace with --field--.

Column 9, Lines 23-24 delete "approximately at a" and replace with --approximately a--.

Column 10, Line 19 delete "element" and replace with --elements--.

Column 10, Line 48 delete "102" and replace with --102a--.

Column 10, Line 64 delete "102d" and replace with --102d.--.

Column 11, Line 6 delete "102c, 102d spaced" and replace with --102c, 102d, are spaced--.

Column 11, Line 11 delete "feedback, coupling" and replace with --feedback coupling--.

Column 11, Line 32 delete "102a" and replace with --110a--.

Column 11, Line 34 delete "102b" and replace with --110b--.

Column 11, Line 62 delete "142a is disposed" and replace with --142a disposed--.

Signed and Sealed this
Fourteenth Day of September, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,557,873 B2

Column 12, Line 13 delete "a fifth" and replace with --fifth--.

Column 12, Line 14 delete "a sixth" and replace with --sixth--.

Column 13, Line 28 delete "in second" and replace with --in a second--.

Column 15, Line 6 delete "signal is indicative" and replace with --signal indicative--.

Column 16, Line 23 delete "generate" and replace with --generating--.

Column 17, Lines 33-34 delete "at least one of at least one of an" and replace with --at least one of an--.

Column 18, Line 17 delete "334 can be configured" and replace with --334 configured--.

Column 19, Line 12 delete "412." and replace with --412).--.

Column 19, Line 17 delete "such a" and replace with --such that a--.

Column 19, Line 21 delete "such a" and replace with --such that a--.

Column 19, Line 35 delete "such no" and replace with --such that no--.

In the Claims

Column 22, Line 21 Claim 24, delete "sensing and" and replace with --sensing means and--.